(12) United States Patent
Asa et al.

(10) Patent No.: US 7,330,081 B1
(45) Date of Patent: Feb. 12, 2008

(54) DIGITALLY CONTROLLED OSCILLATOR AND ASSOCIATED METHOD

(75) Inventors: Gil Asa, Zikhron Ya'akov (IL); David Moshe, D.N. Gilboa (IL); Ido Bourstein, Pardes Hana (IL)

(73) Assignee: Marvell Semiconductor Israel Ltd., Yokneam (IL)

( * ) Notice: Subject to any disclaimer, the term of this patent is extended or adjusted under 35 U.S.C. 154(b) by 81 days.

(21) Appl. No.: 11/178,130

(22) Filed: Jul. 7, 2005

Related U.S. Application Data

(60) Provisional application No. 60/646,827, filed on Jan. 24, 2005.

(51) Int. Cl.
*H03B 5/04* (2006.01)
*H03B 5/24* (2006.01)
*H03K 3/03* (2006.01)
*H03L 1/00* (2006.01)
*H03L 5/02* (2006.01)

(52) U.S. Cl. .................... 331/57; 331/179; 331/183; 331/186

(58) Field of Classification Search ............. 331/36 C, 331/57, 179, 182–183, 185–186
See application file for complete search history.

(56) References Cited

U.S. PATENT DOCUMENTS

| | | | |
|---|---|---|---|
| 5,208,725 A | | 5/1993 | Akcasu |
| 5,302,920 A | * | 4/1994 | Bitting .................. 331/45 |
| 6,028,488 A | | 2/2000 | Landman et al. |
| 6,094,105 A | | 7/2000 | Williamson |
| 6,452,430 B1 | * | 9/2002 | Tung et al. ............. 327/156 |
| 6,625,006 B1 | | 9/2003 | Aram et al. |
| 6,658,748 B1 | | 12/2003 | Leipold et al. |
| 6,791,422 B2 | | 9/2004 | Staszewski et al. |
| 6,903,615 B2 | | 6/2005 | Landman et al. |

* cited by examiner

*Primary Examiner*—David Mis

(57) ABSTRACT

A digitally controlled oscillator circuit is provided that comprises a ring oscillator including multiple inverters; multiple digitally controlled capacitors (DCCs), each coupled to apply a digitally controllable amount of capacitance to an output of a different one of the inverters; and control circuitry operable to change an amount of capacitance applied to each inverter during operation of the ring oscillator and to cause the multiple DCCs to apply substantially the same amounts of capacitance to each of the inverter throughout operation of the ring oscillator.

32 Claims, 12 Drawing Sheets

C1[1:16]

| 1 | 1 | 1 | 1 | 1 | 1 | 1 | 0 | 0 | 0 | 0 | 0 | 0 | 0 | 0 | 0 |

Figure 9A

Increment C1

| 1 | 1 | 1 | 1 | 1 | 1 | 1 | 1 | 0 | 0 | 0 | 0 | 0 | 0 | 0 | 0 |

Figure 9B

Decrement C1

| 1 | 1 | 1 | 1 | 1 | 1 | 0 | 0 | 0 | 0 | 0 | 0 | 0 | 0 | 0 | 0 |

Figure 9C

DIGITALLY CONTROLLED OSCILLATOR AND ASSOCIATED METHOD

CROSS REFERENCE TO RELATED APPLICATION

The present application claims benefit of earlier filed provisional patent application, U.S. Application No. 60/646,827, filed on Jan. 24, 2005, and entitled "DCO Methodology," which is hereby incorporated by reference as if fully set forth herein.

BACKGROUND OF THE INVENTION

1. Field of the Invention

The invention relates in general to integrated circuit oscillators, and more particularly, to digitally controlled oscillators (DCOs).

2. Description of the Related Art

Ring oscillators are important building blocks in many digital communications systems. For example, they are used in applications such as clock recovery circuits for serial data circuits communications, disk-drive read channels, on-chip clock distribution and integrated frequency synthesizers. A ring oscillator in its simplest form consists of an odd number of inverters connected in a circular chain. The circuit oscillates since it has no stable operation point. Ring oscillator frequency is determined by propagation time through the chain of inverters.

The oscillation frequency of a voltage-controlled ring oscillator (VCO) typically is monitored and adjusted based upon an analog voltage. However, such prior VCOs often have been especially sensitive to control noise or power supply noise. Moreover, integration of both analog and digital components in an integrated circuit can be especially challenging.

A digitally controlled oscillator (DCO) is one alternative to a VCO. One implementation of a DCO employs digitally controlled capacitance inserted in a ring oscillator to select oscillation frequency. Capacitors of different sizes can be digitally switched in and out of a ring oscillator inverter chain to control delay, and therefore, the oscillation frequency.

There have been problems with implementing DCOs, however. For example differences in capacitance applied to different inverters in an inverter chain can limit oscillator frequency range. Parasitic capacitance also can limit frequency range. Power supply noise and ground noise can impact frequency stability. Frequency glitches may occur during adjustment of oscillator frequency due to different switching delays for different capacitors, for instance.

Thus, there has been a need for improvement in DCOs using digitally controlled capacitors. The present invention meets this need.

SUMMARY OF THE INVENTION

A digitally controlled oscillator circuit is provided that includes a ring oscillator having multiple inverters and multiple digitally controlled capacitors (DCCs), each being operable to apply a digitally controllable amount of capacitance to an output of a different one of the inverters. Changing the capacitance the DCO oscillation frequency.

In one aspect of an embodiment of the invention, control circuitry is operable to change an amount of capacitance applied to each inverter during operation of the ring oscillator and to cause the multiple DCCs to apply substantially the same amounts of capacitance to each of the inverters throughout operation of the ring oscillator. In one embodiment, symmetry of the oscillator system causes the ring oscillator to pull substantially constant current from its power supply resulting in less self-induced noise and close to fifty percent duty cycle. This stability, in turn, contributes to larger dynamic range and smaller inner jitter.

In another aspect of an embodiment of the invention a method of operating a multiple inverter ring oscillator is provided, which involves changing an amount of capacitance applied to each inverter during operation of the ring oscillator, while applying substantially equal amounts of capacitance to each of the inverters. In yet another aspect of the invention, applying substantially the same amounts of capacitance to each of the inverters includes applying a controllable amount of capacitance from each of multiple means for applying a capacitance to a different one of multiple means for inverting and causing each of the multiple individual means for applying to apply a substantially equal amount of capacitance to a different one of the means for inverting. Still another aspect of the invention includes guarding against variations in amplitude of oscillation of the inverters in the presence of voltage noise.

One embodiment includes multiple sets of switches, each set of switches operable to selectable switch apply a controllable amount of capacitance from one of the DCCs to one of the inverters. Control circuitry is operable to cause the multiple sets of switches to change the amount of capacitance applied to each inverter during operation, to change the oscillation frequency of the ring oscillator for example, while still causing the amount of capacitance applied to each of the inverters to be substantially equal during operation of the ring oscillator at different frequencies.

In another aspect of an embodiment of the invention, voltage stabilizing circuitry maintains a substantially fixed voltage difference between the power supply voltage and the effective ground voltage. Multiple guard transistors are biased based upon this fixed difference between the power supply voltage and the effective ground voltage and are coupled to cause the inverters in the ring oscillator to oscillate at a constant amplitude even in the presence of voltage noise.

In one embodiment of an embodiment of the invention, each inverter is biased between a power supply voltage and an effective ground level voltage. Voltage stabilizing circuitry is operable to maintain a substantially fixed voltage difference between the power supply voltage and the effective ground voltage despite possible variations the power supply voltage. Multiple guard transistors are biased based upon the substantially fixed difference between the power supply voltage and the effective ground voltage. The guard transistors are coupled to cause the inverters in the ring oscillator to oscillate at a substantially constant amplitude even in the presence of voltage noise.

In still another aspect of an embodiment of the invention, a DCC system increments and decrements capacitance applied to each inverter in smaller amounts while using fewer individual capacitors overall. Consequently, fewer routing lines are required to control the capacitors resulting in reduced overall parasitic capacitance.

One embodiment of the invention includes multiple DCCs, and each DCC includes multiple sets of capacitors. The capacitors of a first capacitor set within each DCC each have a first capacitance value. The capacitors of a second capacitor set within each DCC each have a second capacitance value that is larger than the first capacitance value. Control circuitry is provided that is operable to control a total amount of capacitance applied from a given DCC to one of the inverters by causing the DCC to apply to the output the inverter one or more capacitors from the second set instead of applying a substantially equivalent amount of capacitance from the first set if the total amount of capacitance exceeds a prescribed multiple of the first capacitance value by a prescribed amount. In this manner, a larger capacitance from the second set may be selectably applied to the inverter instead of several smaller capacitances from the first set. Thus, the total number of individual capacitances in a DCC used to cover some range of capacitances is reduced. Yet, capacitance applied to the inverter still may be easily incremented or decremented in smaller or larger amounts through appropriate selection of combinations of capacitances from the first and second sets. In one embodiment, several sets of capacitances are provided and are controlled by the control circuitry to apply a wide range of possible capacitance values to the inverter with relatively few capacitors.

Another embodiment of the invention is for use in controlling capacitance applied by a digitally controlled capacitor that includes multiple sets of capacitors; and an output; wherein the capacitors of a first capacitor set each have a first capacitance value; and wherein capacitors of a second capacitor set each have a second capacitance value that is larger than the first capacitance value. The method involves causing one or more capacitors from the second set to be applied to the output instead of a substantially equivalent amount of capacitance from the first set if the total amount of capacitance exceeds a prescribed multiple of the first capacitance value by a prescribed amount.

In another aspect of an embodiment of the invention, a digitally controlled capacitor system includes multiple sets of capacitors. The capacitors of a first capacitor set each have a first capacitance value. The capacitors of a second capacitor set each have a second capacitance value that is larger than the first capacitance value. The system also includes an output to which capacitance may be applied. Control circuitry is operable to cause one or more capacitors from the second set to be applied to the output instead of a substantially equivalent amount of capacitance from the first set if the total amount of capacitance exceeds a prescribed multiple of the first capacitance value by a prescribed amount.

In yet another aspect of an embodiment of the invention voltage level shifting is achieved with substantially equal delay for low-to-high and high-to-low transitions. The level shifting circuit can be used to turn capacitors on and off equally fast, reducing the risk of frequency glitch during changes in ring oscillator frequency of operation.

One embodiment of the invention includes an input inverter including a first pull up transistor and a first pull-down transistor biased between a first voltage level and a second voltage level. The embodiment also includes an output inverter including a second pull up transistor and a second pull-down transistor biased between third voltage level and fourth voltage level. A voltage shifting circuit is provided that is operable to shift an output of the first inverter from the first voltage level to the third voltage level without inversion and is operable to shift an output of the first inverter from the second voltage level to the fourth voltage level without inversion. The voltage shifting circuit is operable to apply the shifted voltage to an input of the output inverter. Thus, the level shift circuitry shifts the voltage level without an inverter delay regardless of whether a higher or lower level input voltage is applied to the input inverter, and voltage shifts can occur substantially equally fast for high and low logic inputs to the first inverter.

Another embodiment of the invention provides a method of shifting the voltage level of a logic signal. The method involves receiving a logic signal at a first inverter biased between a between a first voltage level and a second voltage level and providing an inverted logic signal at an output of the first inverter. If the inverted logic signal has the first voltage level, then the inverted logic signal is voltage level shifted from the first voltage level to a third voltage level that is higher than the first voltage level without a logic inversion operation during the level shifting. If the inverted logic signal has the second voltage level, then the inverted logic signal is voltage level shifted from the second voltage level to a fourth voltage level that is lower than the third voltage level without a logic inversion operation during the level shifting. The level shifted inverted logic signal is provided to an input of a second inverter biased between the third voltage level and the fourth voltage level.

These and other features and advantages of one or more embodiments of the invention will become more apparent from the following detailed description of embodiments thereof in conjunction with the drawings.

BRIEF DESCRIPTION OF THE DRAWINGS

FIGS. 9A-9C are illustrative drawings showing example states of a one shift register of FIGS. 7-8 following reset, increment and decrement operations.

DETAILED DESCRIPTION OF THE PREFERRED EMBODIMENTS

Figure 1:
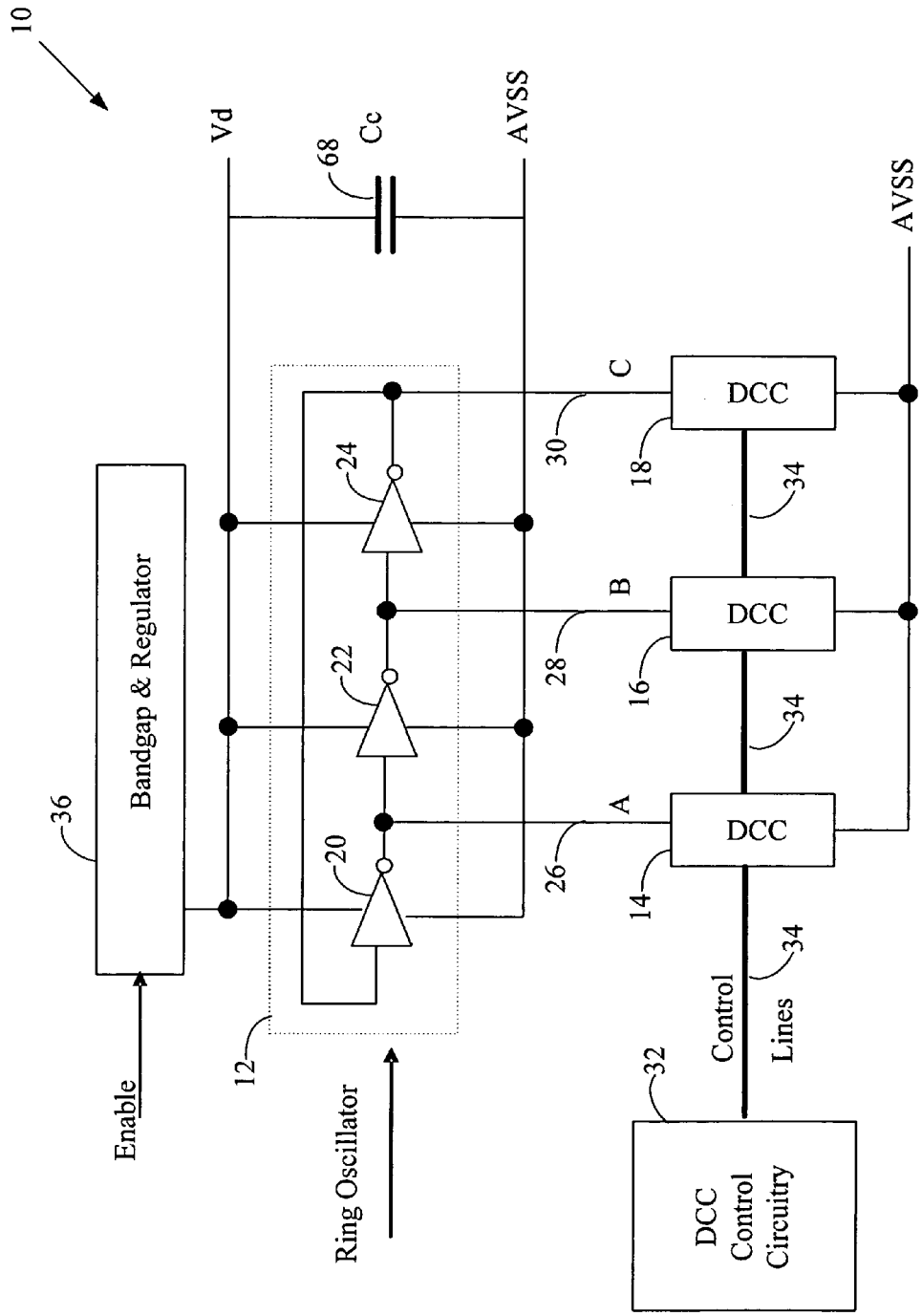
FIG. 1 is an illustrative schematic diagram of a digitally controlled oscillator (DCO) system in accordance with an embodiment of the invention.

The following description is presented to enable any person skilled in the art to make and use a novel digitally controlled oscillator (DCO) and novel components thereof in accordance with the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and devices are shown in block diagram form in order not to obscure the description of the invention with unnecessary detail. Moreover, in order to simplify the description, certain identical components have been labeled with identical reference numerals. Thus, the present invention is not intended to be limited to the embodiments shown, but is to be accorded the widest scope consistent with the principles and features disclosed herein.

FIG. 1 is an illustrative schematic diagram of a digitally controlled oscillator system 10 in accordance with an embodiment of the invention. The oscillator system 10 includes a multi-stage ring oscillator 12 and multiple digitally controlled capacitors (DCCs) 14, 16, 18. In one embodiment, the ring oscillator includes three inverter stages 20, 22, 24 biased between a high voltage level VDD (which is regulated) and an effective ground level voltage AVSS, a so called "Analog VSS" which comes from a separate pad and serves only analog circuits such as PLL etc. Each DCC is associated with one of the ring oscillator stages. A first DCC 14 is coupled between a first inverter stage 20 and AVSS. A second DCC 16 is coupled between a second inverter stage 22 and AVSS. A third DCC 18 is coupled between a third inverter stage 24 and AVSS. More specifically, each respective DCC is associated with a respective capacitive load gathering line. The first DCC 14 is coupled to a first load gathering line 26 that is coupled between output and input nodes of the respective first and second inverter stages 20 and 22. The second DCC 16 is coupled to a second load gathering line 28 that is coupled between output and input nodes of the respective second and third inverter stages 22 and 24. The third DCC 18 is coupled to a third load gathering line 30 that is coupled between output and input nodes of the respective third and first inverter stages 24 and 20. The system 10 includes DCC control circuitry 32 coupled to provide capacitance control signaling on line 34. The system 10 also includes bandgap and regulator circuitry 36, which serves as voltage stabilizing and filtering circuitry that serves to stabilize the ring oscillator frequency and to filter out self-induced noise. The bandgap produces a constant reference voltage for the regulator which holds that voltage as VDD supply of the DCO. A coupling capacitance $C_C$ 68 is coupled between VDD and AVSS.

Figure 2:
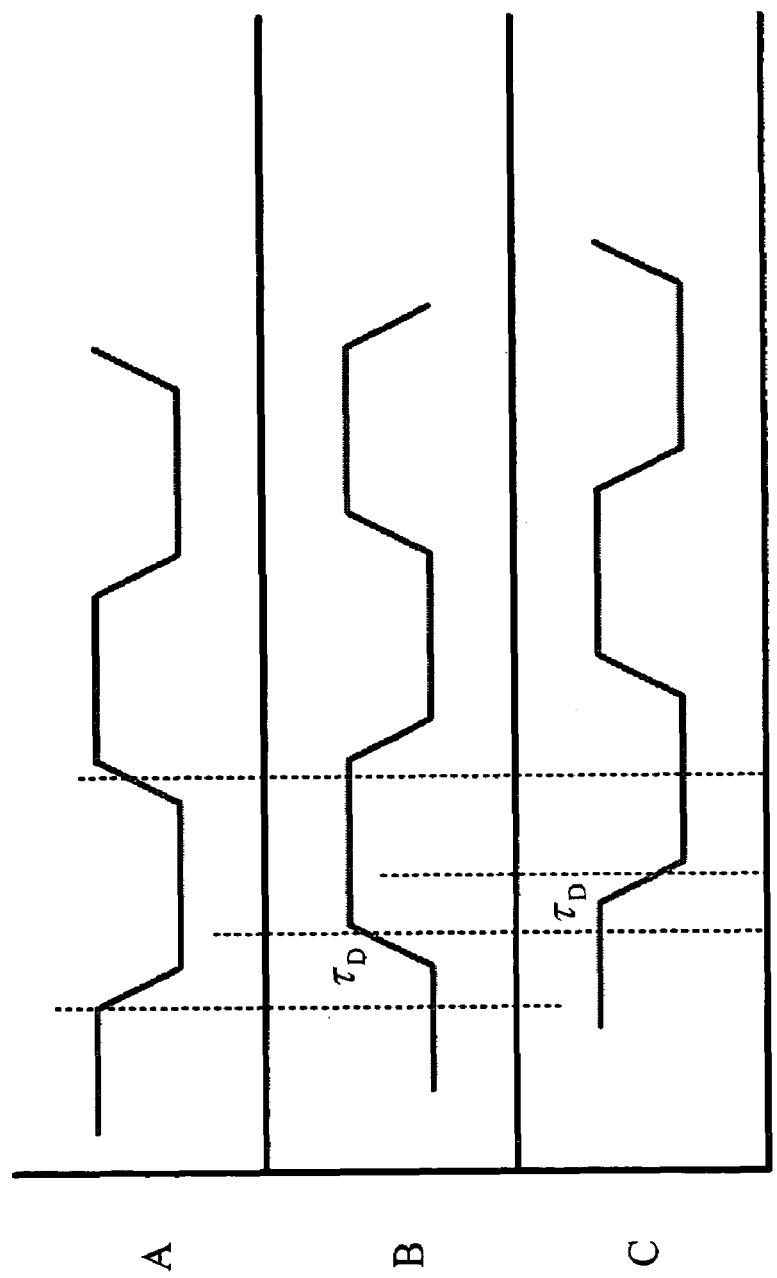
FIG. 2 is an illustrative drawing of signal oscillations by the three stages of the illustrative ring oscillator of FIG. 1.

FIG. 2 is an illustrative drawing of signal oscillations by the three stages of the illustrative ring oscillator system 10 of FIG. 1. The period of oscillation of each stage is T-2n$\tau_D$, where n is the number of stages. The frequency of oscillation of each stage is 1/T. The frequency of oscillation can be changed by changing the capacitive loading on the of the three oscillators. The DCC control circuitry 32 controls the multiple DCCs 14-18 to adjust the capacitive loading applied by each to its respective capacitive load gathering line 26-30. During normal operation, the control circuitry 32 causes each of the multiple DCCs to apply substantially the same amount of capacitance to its respective gathering line. Thus, each of the inverter stages 20-24 experiences substantially the same capacitive load.

By loading each inverter stage 20-24 with substantially the same capacitance values for any given frequency of operation, the oscillator amplitude of each stage can be kept at the substantially the same level for each stage. An advantage applying the substantially the same amount of capacitance load to each inverter stage is wider oscillator range of operation and avoidance of dead zones, frequencies within the range of operation at which the oscillator does not operate. In one embodiment, the amplitude range of oscillator system 10 is kept at full rail-to-rail for all frequencies of operation. Moreover, the symmetry of the oscillator system causes the ring oscillator system 10 to pull substantially constant current from VDD, resulting in less self-induced noise and close to fifty percent duty cycle. This stability, in turn, contributes to larger dynamic range and smaller inner jitter.

Figure 3:
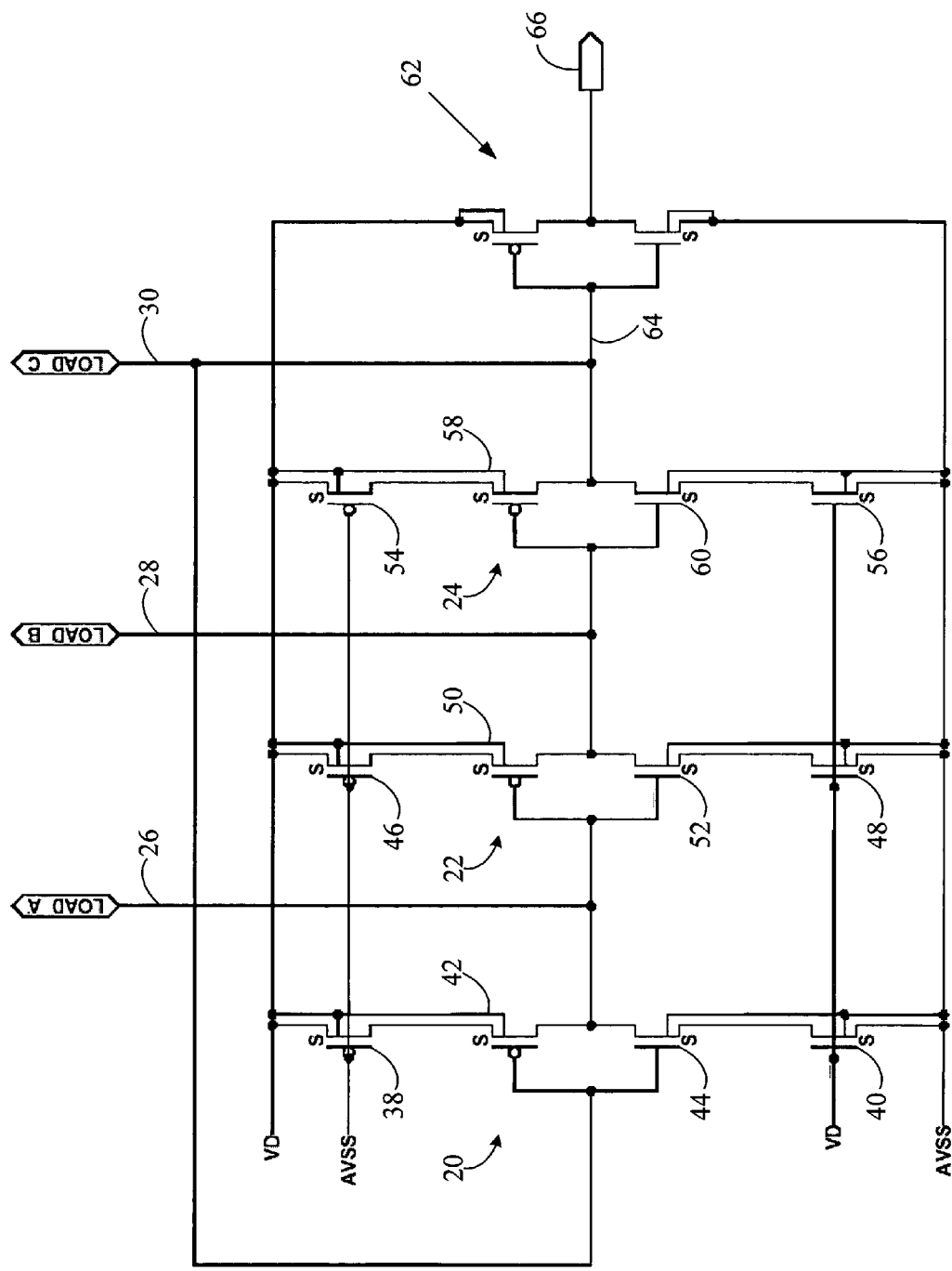
FIG. 3 is an illustrative circuit diagram showing details of the ring oscillator of the DCO of FIG. 1 and showing guard transistors in accordance with an embodiment of the invention.

FIG. 3 is an illustrative circuit diagram showing details of the ring oscillator 12 of FIG. 1 and showing guard transistors. In one embodiment, each inverter stage includes one single ended inverter. Also, each respective inverter stage includes a pair of guard transistors. For example, a first inverter stage includes a first p-type guard transistor 38 and a first n-type guard transistor 40. The first p-type guard transistor 38 has a first S/D node coupled to the VDD power supply line and has a second S/D node coupled to a S/D node of a p-type pull-up transistor 42 of the first inverter stage 20. A gate of the first p-type guard transistor 38 is coupled to a AVSS effective ground line. The first n-type guard transistor 40 has a first S/D node coupled to the AVSS effective ground line and has a second S/D node coupled to a S/D node of an n-type pull-down transistor 44 of the first inverter stage 20. A gate of the first n-type guard transistor 40 is coupled to the VDD power supply line.

The second inverter stage 22 includes respective second p-type and second n-type guard transistors 46 and 48 that are similarly coupled to respective p-type pull-up 50 and n-type pull-down 52 transistors of the second inverter stage 22. The third inverter stage 24 also includes respective third p-type and third n-type guard transistors 54 and 56 that are similarly coupled to respective p-type pull-up 58 and n-type pull-down 60 transistors of the third inverter stage 24.

An output driver inverter 62 drives out an oscillator signal without disturbing oscillations. An input 64 to the inverter 62 is coupled to the third capacitance gathering line 30 which is loaded with the capacitive load applied by the third DCC 18. The output driver inverter 62 provides the oscillator output on line 66.

During operation, for example, the guard transistors protect the ring oscillator from voltage noise such as power supply noise or ground noise, for example. The Vgs of each guard transistor remains at AVSS-VDD during operation for each of the p-type and the n-type guard transistors. Meanwhile, the bandgap and regulator circuitry 36 shown in FIG. 1, regulate VDD relative to VSS so that VDD and AVSS move together by the same amount if one or the other varies. The coupling capacitance $C_C$ 68 between VDD and AVSS also contributes to causing VDD and AVSS to move together by the same amount if one or the other varies. Since VDD and AVSS vary in unison, the voltage AVSS-VDD remains sufficiently fixed that the ring oscillator can operate at constant full rail-to-rail amplitude even in the presence of noise, such as ground noise due to variation in AVSS, for example.

An alternative embodiment of the invention includes differential inverter stages. In general, a DCO that employs differential stages may be less sensitive to power supply noise.

Although the oscillating signal may not be rail to rail and the frequency range may be decreased somewhat.

Figure 4:
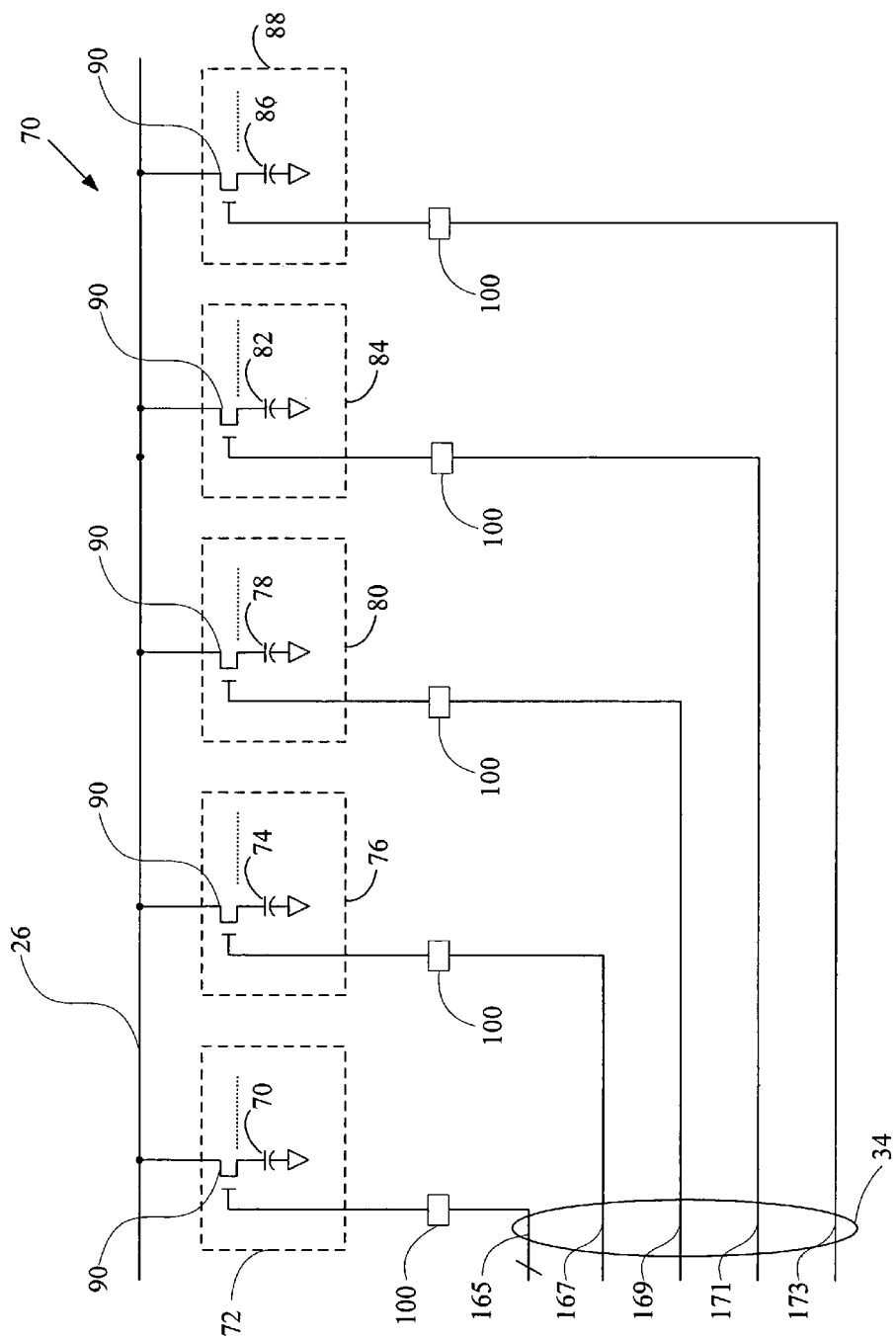
FIG. 4 is an illustrative schematic diagram showing details of one of the digitally controlled capacitors of the embodiment of FIG. 1.

FIG. 4 is an illustrative schematic diagram showing details of one of the digitally controlled capacitors of the embodiment of FIG. 1. In particular, this drawing shows details of the first DCC 14, although the description applies to all three DCCs 14, 16 and 18, which are substantially the same in a preferred embodiment of the invention. The DCC 14 includes a multiplicity of capacitors that are grouped into multiple sets of individual capacitors. Each set of capacitors contains capacitors having the same capacitance value. The individual capacitance value of the capacitors of each set is different from the individual capacitance value of the capacitors of other sets. The illustrative DCC embodiment 14 includes five different sets of capacitors 72-80. In order to simplify the drawings and to avoid obscuring inventive features with too many details, only one capacitor is shown for each one of the multiple sets, although it will be appreciated that each set includes a plurality of individual capacitors.

In one embodiment, a capacitance value of the individual capacitors 70 of a first set of capacitors 72 is one-half the capacitor value of the individual capacitors 74 of a second set of capacitors 76. Individual capacitors 78 of a third set of capacitors 80 each have capacitance value that is four times the capacitance value of the individual capacitors 70 of the first set 72 and that is twice the capacitance value of the capacitors 74 of the second set 76. Individual capacitors 82 of a fourth set 84 each have a capacitance value that is eight times the capacitance value of the capacitors 70 of the first set 72 and that is twice the capacitance value of the individual capacitors 78 of the third set 80. Individual capacitors 86 of a fifth set of capacitors 88 each have a capacitance value that is sixteen times the capacitance value of the capacitors 70 of the first set 72 and that is twice the capacitance value of the individual capacitors 82 of the fourth set 84. It will be appreciated that different numerical relationships between capacitance values of the various sets of capacitors may be employed consistent with the invention.

The DCC 14 includes a multiplicity of individual switches 90 each associated with an individual respective capacitors. In order to simplify the drawings and to avoid obscuring inventive features with too many details, only one switch 90 is shown for each one of the multiple sets of capacitors, although in one embodiment, each of the multiple capacitors in each set is associated with its own individual switch. Each switch is used to selectively apply its associated capacitor to the gathering line 26 if the switch is in a first switch state and to isolate its associated capacitor from the gathering line 26 if the switch is in a second switch state. More specifically, for example, a switch 90 selectively couples and uncouples capacitor 70 to gathering line 26. A switch 90 selectively couples and uncouples capacitor 74 to gathering line 26. A switch 90 selectively couples and uncouples capacitor 78 to gathering line 26. A switch 90 selectively couples and uncouples capacitor 82 to gathering line 26. A switch 90 selectively couples and uncouples capacitor 86 to gathering line 26.

In one embodiment, each individual switch 90 consists of a single n-type transistor. In one embodiment, the n-type transistor is a thick oxide transistor with Vg>>VDD to minimize threshold voltage drop. The higher voltage at the control gate of the switch transistor ensures that a the switch remains on throughout DCO cycles so that the DCO maintains a full voltage swing. An additional advantage of thick oxide is that it results in lower parasitic capacitance. An advantage of using an n-type transistor is that is relatively small size compared with a p-type transistor and results in less parasitic capacitance. Voltage level shifting circuitry 100 shifts the gate (Vg) level of the switch capacitors 90. In one embodiment, each respective individual gate of each individual switch 90 of each of the multiple sets of capacitors 72, 26, 80, 84 and 88 is coupled to a respective individual level shifter circuitry 100.

Figure 5:
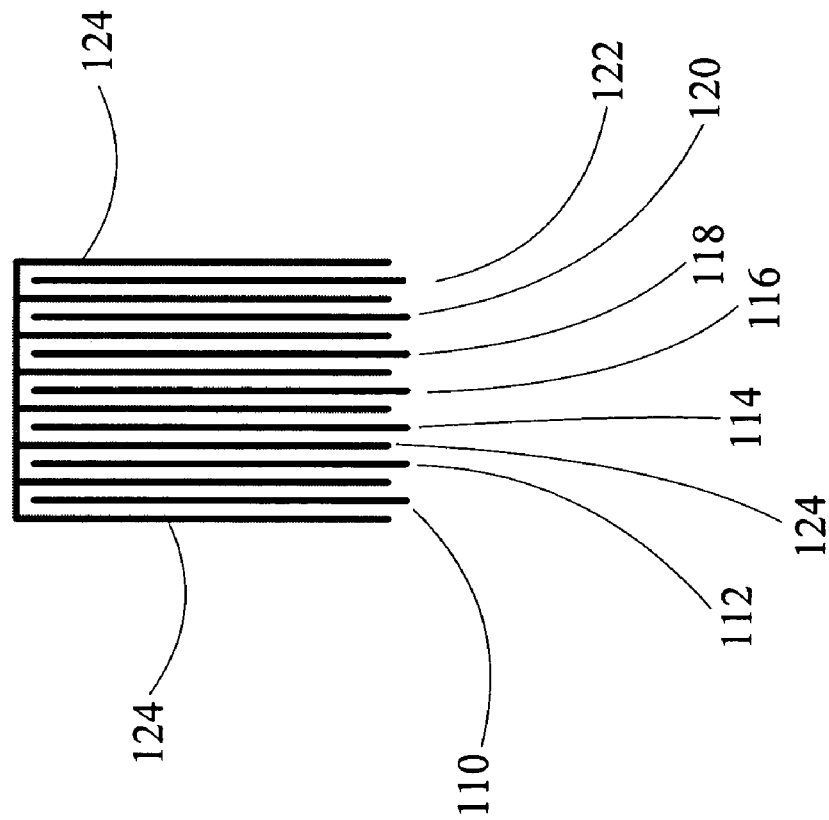
FIG. 5 is an illustrative drawing of a top view of multiple interleaved capacitors within the DCC of FIG. 4 in accordance with an embodiment of the invention.

FIG. 5 is an illustrative drawing of a top view of multiple interleaved capacitors within the DCC of FIG. 4 in accordance with an embodiment of the invention. In one embodiment, the individual capacitors comprise MIM (metal-insulator-metal) capacitors. The capacitors are constructed in a quasi-coaxial structure in which each 'hot' capacitive element is substantially surrounded by grounded elements. More specifically, multiple hot capacitor lines 110-122 are interleaved with multiple grounded capacitor lines 124. Each respective individual hot line 110-122 is coupled to a respective source/drain (S/D) node of a respective individual n-type switch transistor, such as transistors 90. Grounded lines 124 on both sides of a given hot line contribute to capacitor surface area, thus increasing capacitance for each individual capacitor. Each hot line and each grounded line shown in FIG. 5 comprises a metal strip formed in two layers of a semiconductor device surface. It will be appreciated that an isolative material is disposed between the hot lines and the ground lines.

Figure 6:
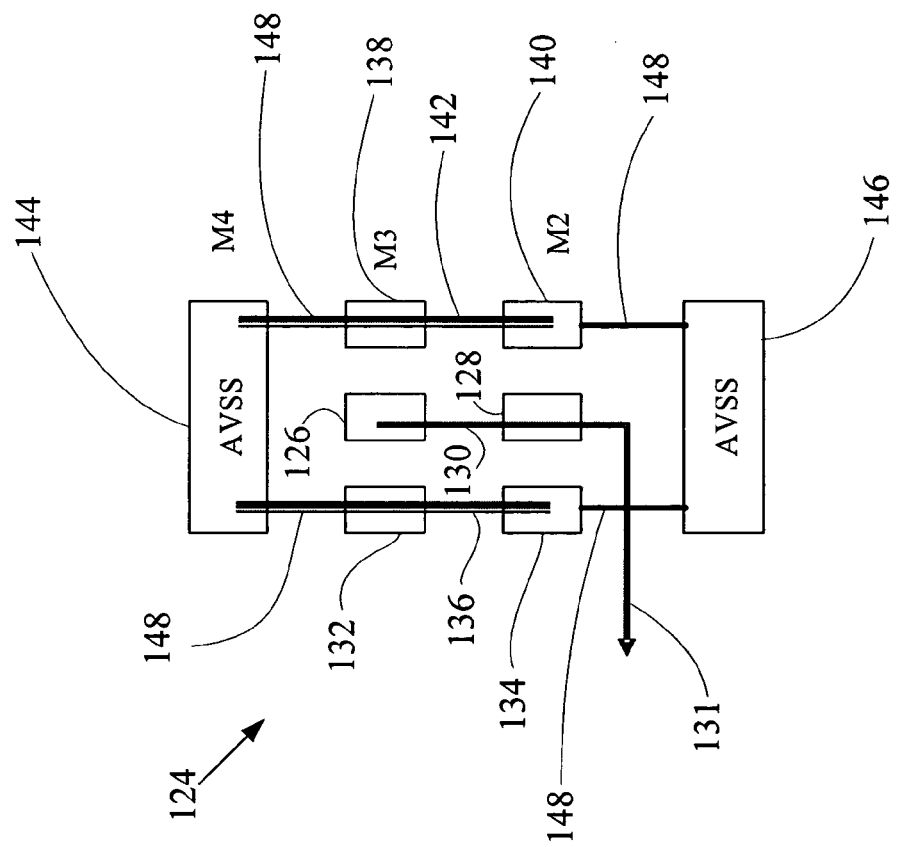
FIG. 6 is an illustrative cross-section view of a single capacitor within the DCC of FIG. 4 in accordance with an embodiment of the invention.

FIG. 6 is an illustrative cross-section view of a single example capacitor 124 within the DCC of FIG. 4 in accordance with an embodiment of the invention. In order to minimize the surface area occupied by individual capacitors, each capacitor is formed in two metal layers and is shielded between two additional metal layers. The capacitor 124 includes a first hot line portion 126 in a second metal layer and a second hot line portion 128 in a third metal layer. The first and second hot line portions 126 and 128 are interconnected by metal vias 130 so as to form a single hot line that is interconnected by line 131 with an individual switch transistor (not shown) as explained above. A first ground line on one side of the hot line includes a first portion 132 adjacent the first portion 126 of the hot line in the second metal layer and includes a second portion 134 directly below it and adjacent second portion 128 of the hot line in the third metal layer. The first and second portions 132 and 134 of the first ground line are interconnected by metal vias 136. Similarly, a second ground line on an opposite side of the hot line includes a first portion 138 adjacent the first portion 126 of the hot line in the second metal layer and includes a second portion 140 directly below it and adjacent the second portion 128 of the hot line in the third metal layer. The first and second portions of the second ground line are interconnected by metal vias 142. The hot line and the surrounding first and second ground lines formed in the second and third metal layers are disposed between a metal first AVSS ground plane 144 in the first metal layer and a second metal AVSS ground plane 146 formed in the fourth metal layer. The first and second ground lines are interconnected by metal vias 148 with the first and second ground planes.

It will be appreciated that the hot line of each individual capacitor is in essence substantially enclosed within a cage of grounded elements. Specifically, each hot line is enclosed between two ground lines and between two ground planes. Also, the metal vias that interconnect the ground elements and ground element portions disposed in different metal layers serve to further enclose the hot lines. This substantially enclosing of the hot lines in a metal cage serves to shield them electromagnetically from each other and from other sources of electromagnetic noise and also to reduce parasitic capacitance.

Figure 7:
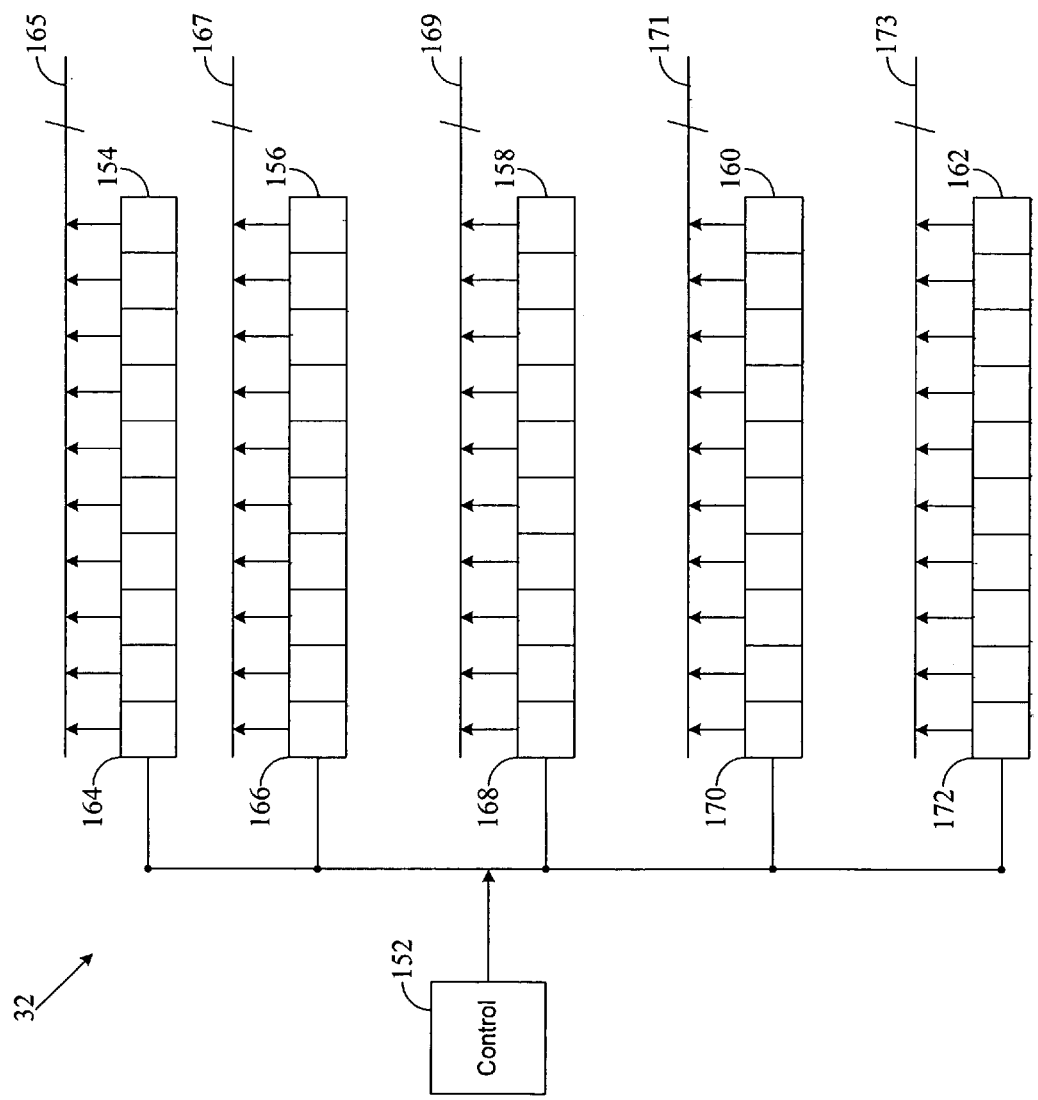
FIG. 7 is an illustrative block diagram of a switch control circuitry used to tune the DCCs of the embodiment of FIG. 1.

FIG. 7 is an illustrative block diagram of a DCC control circuitry 32 used to tune the DCCs of the embodiment of FIG. 1. Control logic 152 is coupled to provide control signaling to multiple control buffers 154-162. In one embodiment, each buffer comprises a multi-stage shift register. Each shift register shown in FIG. 7 is associated with one set of capacitors shown in FIG. 4. For example, a first shift register 154 is associated with the first set of capacitors 72. A second shift register 156 is associated with the first set of capacitors 76. A third shift register 158 is associated with the first set of capacitors 80. A fourth shift register 160 is associated with the first set of capacitors 84. A fifth shift register 162 is associated with the fifth set of capacitors 88.

Furthermore, each individual stage of each shift register shown in FIG. 7 is associated with an individual capacitor control switch 90 shown in FIG. 4. For example, the stage labeled 164 in the first shift register 154 serves as a buffer that can provides a switch control signal, via one of the switch control lines 165, to a gate of a capacitor switch 90 in the first set of capacitors 72. The stage labeled 166 in the second shift register 156 serves as a buffer that can provide a switch control signal, via one of the switch control lines 167, to a gate of a capacitor switch 90 of the second set of capacitors 76. The stage labeled 168 in the third shift register 158 serves as a buffer that can provide a switch control signal, via one of the control lines 169, to a gate of capacitor switch 90 of the third set of capacitors 80. The stage labeled 170 in the fourth shift register 160 serves as a buffer that can provide a switch control signal, via one of the switch control lines 171, to a gate of a capacitor switch 90 of the fourth set of capacitors 84. The stage labeled 172 in the fifth shift register 162 serves as a buffer that can provide a switch control signal, via one of the switch control lines 173, to a gate of capacitor switch 90 of the fifth set of capacitors 88.

It will be appreciated that in one embodiment, each of the switch control lines 165, 167, 169, 171 and 173 includes an individual control line for each individual capacitor switch 90. More specifically, each individual line couples one of the stages of one of the shift registers to the gate of one of the capacitor switches 90, via its respective level shifter circuitry 100. For example switch control lines 165 include a plurality of separate lines, each interconnecting an individual stage of the first buffer 154 to an individual level shifter circuit 100. Each individual level shifter circuit level shifts the control signal that it receives and provides a level shifted version of the control signal to the gate of an individual switch transistor 90 associated with one of the capacitors of the first set 72.

Figure 8:
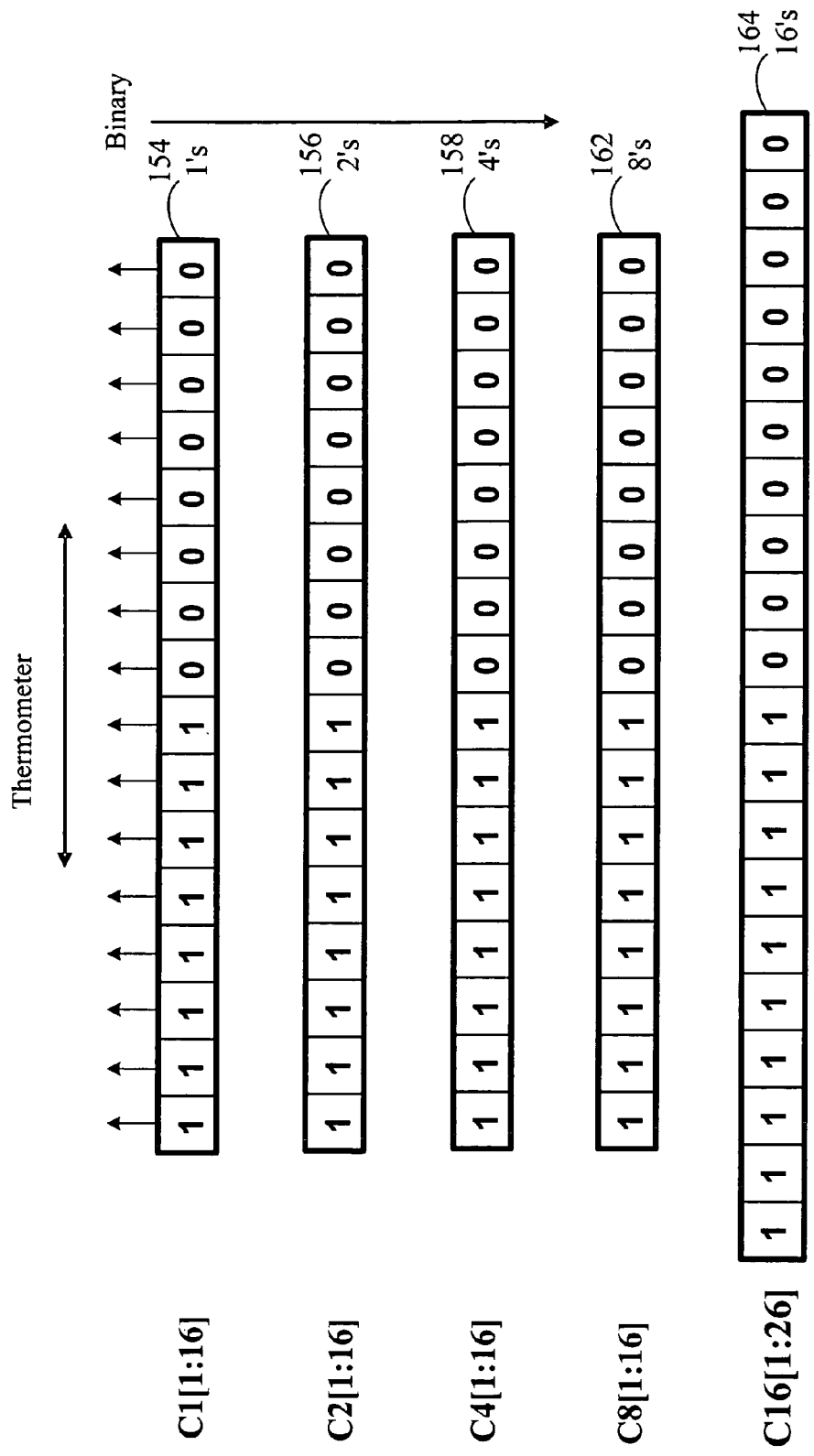
FIG. 8 is an illustrative drawing to illustrate the states of individual buffer stages of the first through fifth shift registers of FIG. 7 following reset.
Figure 10A:
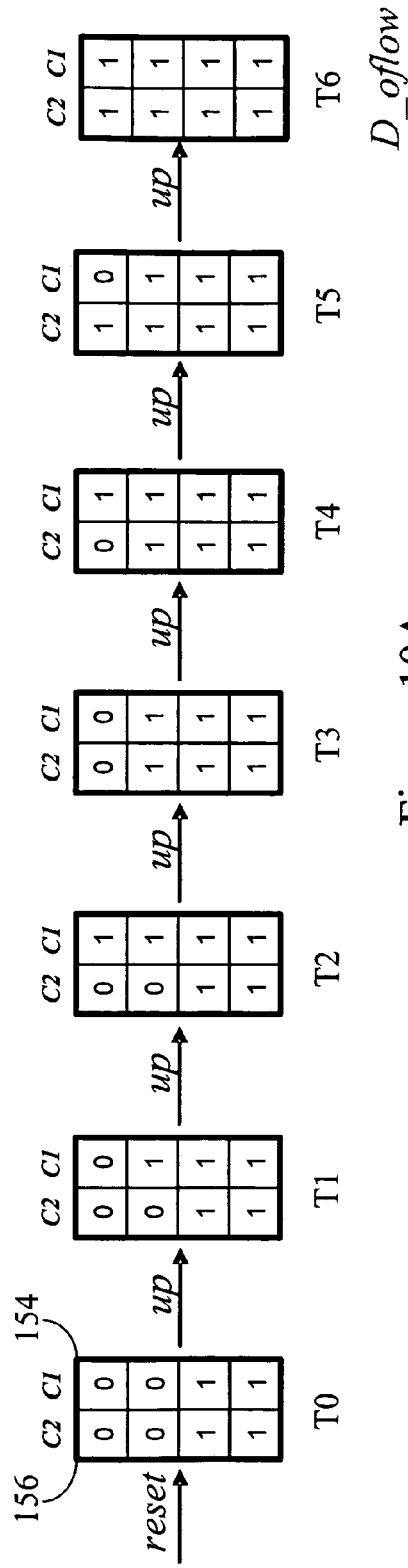
FIGS. 10A-10B are illustrative drawings showing interaction between two shift register buffers during incrementing and during decrementing of control logic circuitry of the embodiment of FIG. 7.
Figure 10B:
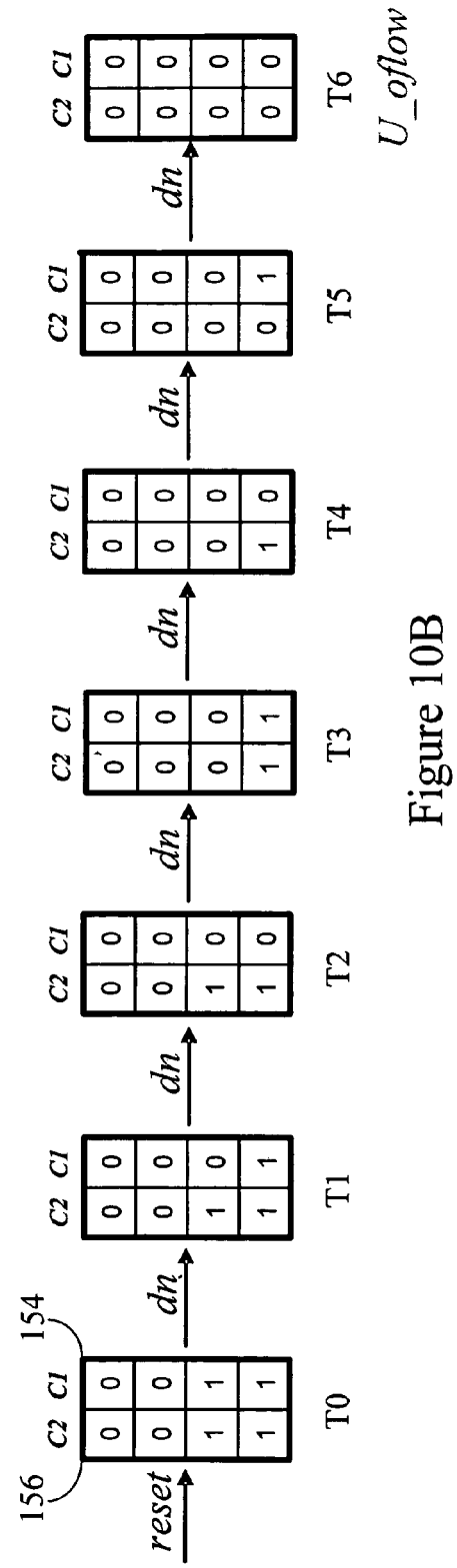

The operation of control logic 152 will be explained with reference to FIGS. 8, 9 and 10A-10B. FIG. 8 is an illustrative drawing showing the states of individual buffer stages of the first through fifth shift registers 154-162 following reset. FIGS. 9A-9C are an illustrative drawings showing example states of a one shift register following reset, increment and decrement operations. FIG. 10A is an illustrative drawing showing interaction between two shift register buffers during incrementing. FIG. 10B is an illustrative drawing showing interaction between two shift register buffers during decrementing.

Referring to FIG. 8, five shift registers 154-164 are shown after a reset under control of the control logic circuitry 152. In one embodiment, the control logic circuitry 152 causes a resetting each shift register by setting the same number of stages to each logic of the logic 0 and logic 1 states. Following reset, each shift register is loaded half with logical 0 values and half with logical 1 values. One advantage of resetting the shift registers in this manner is reduction of the risk of frequency glitches during shift register rollover, for example. It will be appreciated that a DCO in accordance with an embodiment of the invention may be employed in a frequency sensitive circuit such as a phase lock loop (PLL), for example. The locking point of a PLL may vary somewhat with temperature. If a locking point is close to shift register rollover point, for example, then significant jitter could result from a glitch during rollover. Setting the buffers to one-half logic 0 and one-half logic 1 reduces the risks of such glitch problems, since it reduces the number of capacitors that are simultaneously switched.

Referring now to FIGS. 9A-9C, there is shown a single example one of the shift registers following reset, following a single increment operation and following a single decrement operation. In one embodiment, following reset, as shown in FIG. 9A, the shift register is partially set to logic 0 and partially set to logic 1. In one embodiment near half of the register stages are set to each state. Specifically, in one embodiment exactly one-half of the stages are set to logic 0, and one-half of the stages are wet to logic 1. Following a one bit increment, as shown in FIG. 9B, the shift register has shift to the right so that one additional stage is set to logic 1, and one less stage is set to logic 0. Following a one bit decrement, as shown in FIG. 9C, the shift register has shift to the left so that one additional stage is set to logic 0, and one less stage is set to logic 1.

Each of five shift register buffers 154-162 resets, increments and decrements in the same manner. In one embodiment, each incrementing of a shift register causes a turns on one additional capacitor switch per DCC, resulting in an incrementing of the capacitance on each of the capacitance gathering lines by the same amount. Each respective capacitance gathering line serves as an output for a respective DCC. In particular, for example, each incrementing of the third shift register buffer 158 of FIG. 7 turns on an additional switch 90 of the third capacitor set 80 shown in FIG. 4, of each DCC 14, 16, 18, resulting in the coupling of one more capacitor 78, per increment, to each of the three capacitance gathering lines 26, 28, 30. Conversely, decrementing the third shift register buffer 158 of FIG. 7 turns off an additional switch 90 of the third capacitor set 80 shown in FIG. 4, of each DCC 14, 16, 18, resulting in the decoupling of one capacitor 78, per decrement, from each of the three capacitance gathering lines 26, 28, 30.

In a similar manner, each respective individual shift register controls the application of a different incremental amount of capacitance to the capacitance gathering lines 26, 28, 30. It will be appreciated that each individual one of the five illustrative shift registers implements a type of thermometer encoding, Depending upon shift direction, any given one of the registers either increments or decrements the amount of capacitance on the three gathering lines 26, 28, 30 by an amount equal to the individual capacitance value of the individual capacitors of the set of capacitors controlled by that individual register. Specifically, for example, the first shift register 154 controls the application to the gathering lines of capacitance in increments of the value of capacitors, e.g. 70, of the first set of capacitors 72. The second shift register 156 controls the incremental application of capacitors, e.g. 74, of the second set of capacitors 76. The third shift register 158 controls the incremental application of capacitors, e.g. 78, of the second set of capacitors 80. The fourth shift register 160 controls the incremental application of capacitors, e.g. 82, of the second set of capacitors 84. The fifth shift register 162 controls the incremental application of capacitors, e.g. 86, of the fifth set of capacitors 88.

The operation of the control logic circuitry 152 now will be further explained with reference to illustrative drawings FIGS. 10A-10B. FIG. 10A shows a logic value increment sequence under control of control logic 152. FIG. 10B shows a logic value decrement sequence under control of control logic 152.

Referring to FIG. 10A, there are shown the contents of a portion of the first shift register 154 (labeled C1) and a portion of the second shift register 156 (labeled C2) during a sequence of time intervals during which the control logic 152 causes the shift registers 154, 156 to be reset and then causes the shift registers 154, 156 to shift so as to cause the capacitance on the capacitance gathering lines 26, 28, 30 to increment by an amount of the first capacitance value, that is, the value of each individual capacitor 70 of the first set of capacitors 72. It is assumed in this example that the value of each second capacitor 74 is twice that of each first capacitor 70.

FIG. 10A illustrates incrementing of the total capacitance value applied to the gathering lines under control logic 152. At time interval T0, the control logic 152 causes each of the first and second shift registers 154, 156 to be reset so as to be filled with one-half logic 0 bits and one-half logic 1 bits. At time interval T1, the control logic 152 causes a one bit increment in the contents of the first shift register 154. At time interval T2, the control logic 152 causes a second one bit increment in the contents of the first shift register 154. It will be appreciated that at time interval T2, an amount of capacitance on each of the gathering lines has been incremented by a total equal to two times the first capacitance value. At time interval T3, the control logic 152 causes a one bit decrement in the contents of the first shift register 156 and causes a one bit increment in the contents of the second shift register 156. At time interval T3, an amount of capacitance on each of the gathering lines has been incremented by a total equal to three times the first capacitance value. However, that additional capacitance is applied by adding one first capacitor from the first set 72 and one second capacitor from the second set 76. At time interval T4, the control logic 152 causes another one bit increment in the contents of the first shift register 154. At time interval T5, the control logic 152 causes a one bit decrement in the contents of the first shift register 154 and causes a one bit increment in the contents of the second shift register 156. At time interval T5, an amount of capacitance on each of the gathering lines has been incremented by a total equal to five times the first capacitance value. However, that additional capacitance is applied by adding one first capacitor from the first set 72 and two second capacitors from the second set 76. At time interval T6, the control logic 152 causes another one bit increment in the contents of the first shift register 154.

FIG. 10B illustrates decrementing of the total capacitance value applied to the gathering lines under control logic 152. At time interval T0, the control logic 152 causes each of the first and second shift registers 154, 156 to be reset so as to be filled with one-half logic 0 bits and one-half logic 1 bits. At time interval T1, the control logic 152 causes a one bit decrement in the contents of the first shift register 154. At time interval T2, the control logic 152 causes a second one bit decrement in the contents of the first shift register 154. It will be appreciated that at time interval T2, an amount of capacitance on each of the gathering lines has been decremented by a total equal to two times the first capacitance value. At time interval T3, the control logic 152 causes a one bit increment in the contents of the first shift register 154 and causes a one bit decrement in the contents of the second shift register 156. At time interval T3, an amount of capacitance on each of the gathering lines has been decremented by a total equal to three times the first capacitance value. However, the applied capacitance is reduced by removing one first capacitor from the first set 72 and one second capacitor from the second set 76. At time interval T4, the control logic 152 causes another one bit decrement in the contents of the first shift register 154. At time interval T5, the control logic 152 causes another one bit increment in the contents of the first shift register 154 and causes a one bit decrement in the contents of the second shift register 156. At time interval T5, an amount of capacitance on each of the gathering lines has been decremented by a total equal to five times the first capacitance value. However, the applied capacitance has been reduced by removing one first capacitor from the first set 72 and two capacitors from the second set 76. At time interval T6, the control logic 152 causes another one bit decrement in the contents of the first shift register 154.

In one embodiment, the control logic 152 increments capacitance by an amount substantially equal to the smallest capacitor value, i.e. the first capacitor value. Furthermore, the control logic 152 causes a second capacitor from respective the second capacitor set of each DCC to be applied to an associated gathering line if a total capacitance increment exceeds a prescribed multiple of the first capacitance value by a prescribed amount. In this example, the prescribed multiple is two, i.e. two times the first capacitance value, and the prescribed amount is one, i.e. exceeds the prescribed multiple by one first capacitance value. Referring to time increment T3 in FIG. 10A, for instance, the control logic 152 increments the second register 156 and decrements first shift register 154 to cause application of one second capacitance value per DCC and one first capacitance value per DCC rather than three first capacitance values per DCC.

Similarly, in one embodiment, the control logic 152 decrements capacitance by an amount substantially equal to the smallest capacitor value, i.e. the first capacitor value. Furthermore, the control logic 152 causes a second capacitor from respective the second capacitor set of each DCC to be removed from an associated gathering line if a total capacitance decrement exceeds a prescribed multiple of the first capacitance value by a prescribed amount. For example, referring to time increment T3 in FIG. 10B, the control logic 152 decrements the second register 156 and increments first shift register 154 to cause application of one second capacitance value per DCC and one first capacitance value per DCC rather than three first capacitance values per DCC. Again in this example, the prescribed multiple is two times the first capacitance value, and the prescribed amount is one times the first capacitance value.

In one embodiment the control logic 152 implements a state machine that shifts binary values through the multiple sets of registers so as to increment and decrement total capacitance applied to the capacitance gathering lines as explained above. In one embodiment, the second capacitance value is twice ($2^1$) times the first capacitance value. The third capacitance value is four times ($2^2$) the first capacitance value. The fourth capacitance value is eight times ($2^3$) the first capacitance value. The fifth capacitance value is sixteen times ($2^4$) the first capacitance value.

As explained above, as the control logic 152 causes a capacitor from a respective next larger size capacitor set to be selected if a total change in capacitance value exceeds a prescribed multiple of a given capacitance increment value by a prescribed amount. For example in one embodiment, for example, if the total change exceeds two times the third capacitance value by an amount substantially equal to one times the third capacitance value, then one fourth capacitor and one third capacitor are caused to be selected per DCC rather than three third capacitors.

Thus, as the control logic 152 in essence, causes the binary count to increment or decrement, combinations of capacitors from each of the respective DCCs that have the largest individual capacitance values are applied to the respective gathering lines at each increment at each increment or decrement. An advantage of this approach to capacitance control is that lesser number of individual capacitors is required to cover a given capacitance range, even in smaller capacitance increments.

Figure 11:
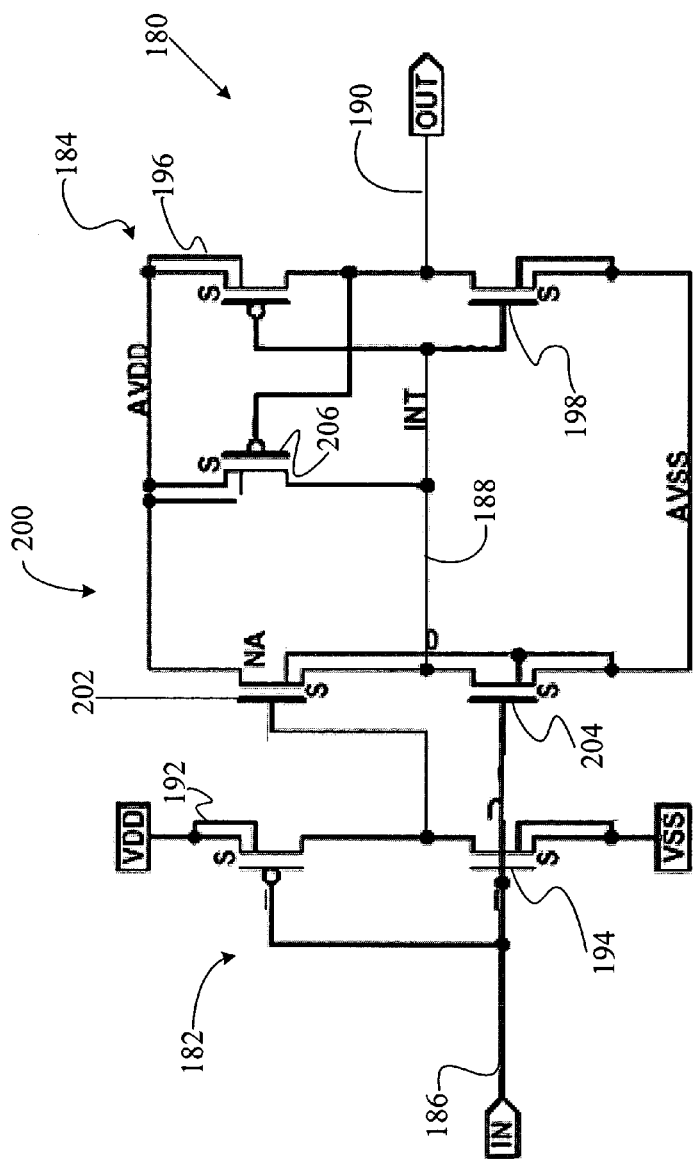
FIG. 11 is an illustrative circuit diagram of a level shifter in accordance with an embodiment of the invention.

FIG. 11 is an illustrative circuit diagram of a level shifter 180 in accordance with an embodiment of the invention. In one embodiment, the level shifter 180 shifts a logic signal, e.g. logic value 1, represented by a voltage level VDD to a higher voltage level AVDD. Conversely, the level shifter 180 shifts a logic signal, e.g. logic value 0, represented by a voltage level VSS to a lower voltage level AVSS.

The level shifter 180 includes an input inverter 182 and an output inverter 184. An input signal line 186 is coupled to provide an input signal to the input inverter 182. An internal input signal line 188 is coupled to provide an input signal to the output inverter 184. An output signal line 190 is coupled to receive an output signal from the output inverter 184.

The input inverter 182 includes a first p-type pull-up transistor 190 and a first n-type pull-down transistor 190. One source/drain (S/D) node of the first p-type pull-up transistor 190 is coupled to voltage level VDD and another S/D node of the first p-type pull-up transistor 190 is coupled to a first S/D node of first n-type pull-down transistor 190. A second S/D node of the first n-type pull-down transistor 190 is coupled to a voltage level VSS.

The output inverter 184 includes a second p-type pull-up transistor 190 and a second n-type pull-down transistor 190. One source/drain (S/D) node of the second p-type pull-up transistor 190 is coupled to voltage level AVDD and another S/D node of the second p-type pull-up transistor 190 is coupled to a first S/D node of second n-type pull-up transistor 190. A second S/D node of the second n-type transistor 190 is coupled to a voltage level AVSS.

The level shifter 180 includes input signal level shifting circuitry indicated generally by reference numeral 200, that produces on internal input signal line a level shifted version of an input signal provided on the input line 186. Specifically, if an input signal at voltage level VDD is provided on the input line 186 coupled to the input inverter 182, then the input signal level shifting circuitry 200 produces an internal input signal at voltage level AVDD on the internal input line 188 coupled to the input of the output inverter 184. Conversely, if an input signal at voltage level VSS is provided on the input line 186 coupled to the input inverter 182, then the input signal level shifting circuitry produces an internal input signal at voltage level AVSS on the internal input line 188 coupled to the input of the output inverter 184.

In one embodiment, the level shifting circuitry 200 includes third and fourth n-type level switching transistors 202 and 204 and a p-type level switching feedback transistor 206. The third n-type transistor 202 has a first S/D node coupled to voltage level AVDD. The third N-type transistor 202 has a second S/D node coupled to the internal input line 188 and to the first S/D node of the fourth n-type transistor 204. The fourth n-type transistor 204 has a second S/D node coupled to voltage level AVSS. The p-type level switching feedback transistor 206 has a first S/D node coupled to the AVDD voltage level and has a second S/D node coupled to the internal input line 188.

A gate of the third n-type level switching transistor 202 is coupled to an output of the first inverter 182, i.e. the junction where the second S/D of the first p-type pull-up transistor 190 is coupled to the first S/D of the first n-type pull-down transistor 190. A gate of the fourth n-type level switching transistor 204 is coupled to receive the same input voltage level as the first n-type pull-down transistor 190. It will be appreciated that, the third and fourth n-type transistors 202, 204 are coupled so they always are in opposite on/off states. If the third n-type transistor 202 is turned on then the fourth n-type transistor 204 is turned off and vise versa.

A gate of the p-type level switching feedback transistor 206 is coupled to the output node 190 of the output inverter 184. Therefore, the on/off state of the p-type feedback transistor 206 will be opposite that of the second p-type pull-up transistor 190 of the output inverter 184. If the second p-type pull-up transistor 190 is turned off then the second p-type feedback transistor 206 is turned on, and if the second p-type pull-up transistor 190 is turned on then the p-type feedback transistor 206 is turned off.

In operation, when a VSS voltage level signal is provided to the input line; the first p-type pull-up transistor 190 turns on, and the first n-type pull-down transistor 190 turns off. The output of the input inverter 182 is VDD, at the junction of the first p-type and n-type transistors, 190, 190 becomes VSS. The input to the third n-type transistor 202 is VDD, which causes that transistor to turn on. The input to the fourth n-type transistor 204 is VSS, which causes that transistor to turn off. The turning on of the third n-type transistor 202 while the fourth n-type transistor 204 is turned off causes the voltage on the internal input line 188 to pull-up toward AVDD. As the voltage on the internal line 188 rises, the second n-type pull-down transistor 190 turns on causing the voltage on the output line 190 to fall. As the voltage on the output line 190 falls, p-type feedback transistor 206 turns on and contributes to the pull up of the internal line 188 to voltage level AVDD. With the internal line 188 at AVDD, the second p-type pull-up transistor 190 is fully turned off, and the second n-type pull-down transistor 190 is fully turned on. The voltage level at the output line driven by the output inverter is AVSS.

In one embodiment, the third and fourth n-type transistors 202, 204 are native transistors. Thus, the third n-type transistor 202 can pull up the internal input line 188 only to its gate voltage, VDD. However, the third n-type transistor 202 can pull up the internal line 188 sufficiently to turn on the second n-type pull-down transistor 190, which causes the voltage at the output line to drop 190. The output voltage drops sufficiently to turn on the p-type feedback transistor 206, which completes the pull-up of the internal input line 188 to AVDD to make sure that the second p-type pull-up transistor 190 fully turns off.

In operation, when a VDD voltage level signal is provided to the input line 186, the first p-type pull-up transistor 190 turns off, and the first n-type pull-down transistor 190 turns on. The output of the input inverter 182, at the junction of the first p-type and n-type transistors 190, 190, becomes VSS. The input to the third n-type transistor 202 is VSS, which causes that transistor to turn off. The input to the fourth n-type transistor 204 is VDD, which causes that transistor to turn on. The turning off of the third n-type transistor 202 while the fourth n-type transistor 204 is turned on causes the voltage on the internal input line 188 to pull-down toward AVSS. As the voltage on the internal line 188 falls, the second p-type pull-up transistor 190 turns on, and the second n-type-type pull-down transistor 190 turns off causing the voltage on the output line 190 to rise to AVDD. The p-type feedback transistor 206 does not have a role in level shifting from VDD to AVDD.

The level shifting circuit of FIG. 11 advantageously level shifts voltage with only a single inversion due to the input inverter driver and a single inverter delay to the output inverter driver. The delay is the same for both shifts from VDD to AVDD and for level shifts from VSS to AVSS. Thus, the risk of frequency glitches is reduced since capacitors can be turned on and turned off with the same level shifting delay.

Figure 12:
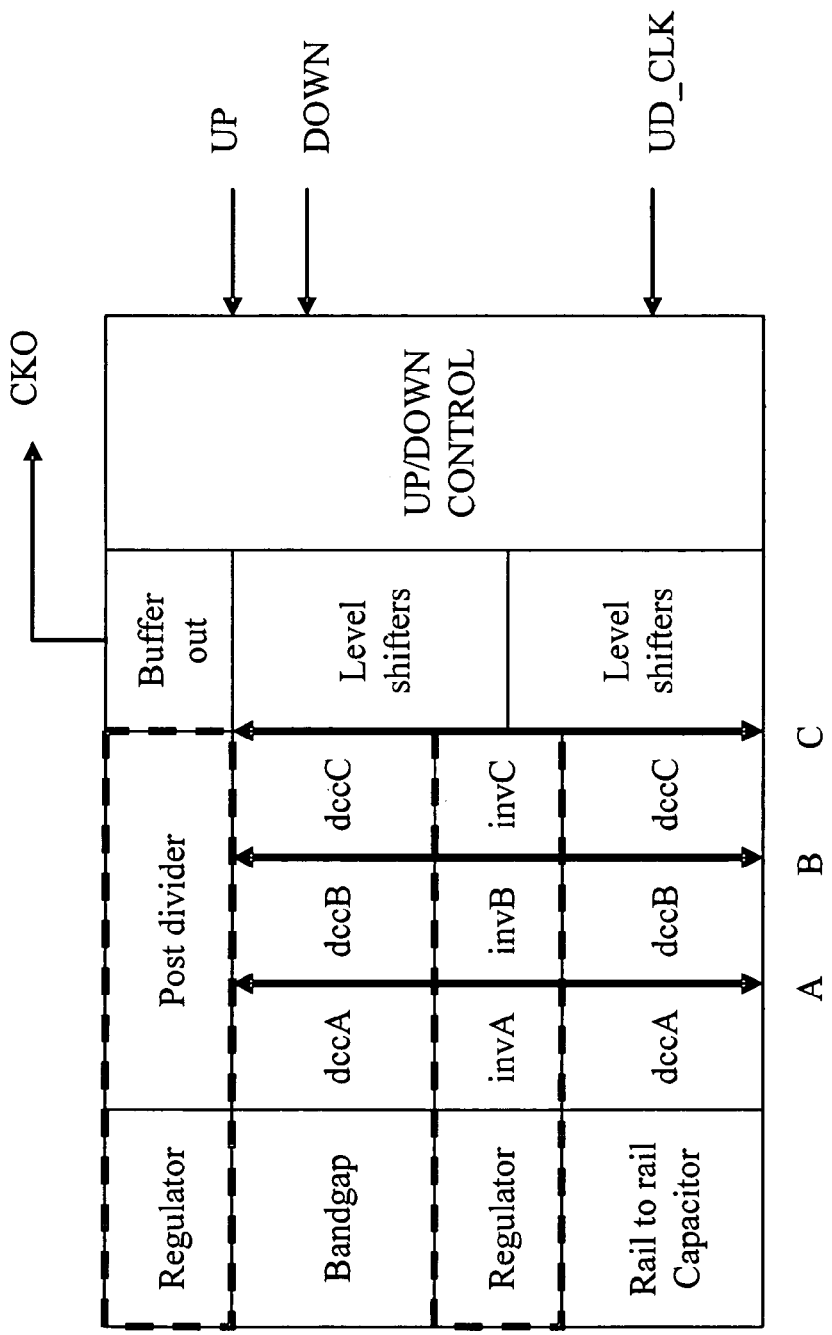
FIG. 12 is an illustrative block diagram showing the layout of a DCO system of an embodiment of the invention.

FIG. 12 is an illustrative drawing of a layout of a DCO system of FIG. 1. The ring oscillator (invA, invB, invC) is symmetric, surrounded by the DCC loading capacitors. As a result, the DCC gathering lines can be kept short, reducing overall parasitic capacitance. The bandgap and the regulator are disposed adjacent the ring oscillator so as to more effectively stabilize and filter the self-induced noise of the ring oscillator. A post divider is coupled to one of the capacitance gathering lines, thereby reducing the amount of high frequency routing. The level shifter circuits are formed between the control logic and the loading capacitors.

While the invention has been described herein with reference to various illustrative features, aspects and embodiments, it will be appreciated that the invention is susceptible of variations, modifications and other embodiments, other than those specifically shown and described. The invention is therefore to be broadly interpreted and construed as including all such alternative variations, modifications and other embodiments within its spirit and scope as hereinafter claimed.

The invention claimed is:

1. A digitally controlled oscillator circuit comprising:
    a ring oscillator including multiple inverters;
    multiple digitally controlled capacitances (DCCs), each applying a digitally controllable amount of capacitance to an output of a different one of the inverters; and
    a plurality of guard transistors that guard said inverters from voltage noise.

2. The circuit of claim 1 further including:
    control circuitry operable to cause the multiple DCCs to apply substantially the same amount of capacitance to each of the inverters.

3. The circuit of claim 1 further including:
    control circuitry operable to change an amount of capacitance applied to each inverter during operation of the ring oscillator and to cause the multiple DCCs to apply substantially the same amount of capacitance to each of the inverters throughout operation of the ring oscillator.

4. The circuit of claim 1 further including:
    multiple sets of switches, each set of switches controllable to determine an amount of capacitance applied from one of the DCCs to one of the inverters; and
    control circuitry operable to cause the multiple sets of switches to change the amount of capacitance applied to each inverter during operation of the ring oscillator and to cause the switches to apply substantially equal amounts of capacitance to each of the inverters.

5. The circuit of claim 1,
    wherein each inverter is biased between a power supply voltage and an effective ground level voltage; and further including:
    voltage stabilizing circuitry operable to maintain a substantially fixed voltage difference between the power supply voltage and the effective ground voltage despite variations the power supply voltage,
    wherein said plurality of guard transistors are biased based upon the substantially fixed difference between the power supply voltage and the effective ground voltage and coupled to cause the inverters in the ring oscillator to oscillate at a substantially constant amplitude even in the presence of voltage noise.

6. The circuit of claim 1,
    wherein each inverter is biased between a power supply voltage and an effective ground level voltage; and further including:
    voltage stabilizing circuitry operable to maintain a substantially fixed voltage difference between the power supply voltage and the effective ground voltage despite variations the power supply voltage,
    wherein said plurality of guard transistors comprise:
        multiple respective p-type pull-up guard transistors each coupled between the power supply and a different one of the inverters and each biased based upon the substantially fixed difference between the power supply voltage and the effective ground voltage; and
        multiple respective n-type pull-down guard transistors each coupled between the power supply and a different one of the inverters and each biased based upon the substantially fixed difference between the power supply voltage and the effective ground voltage.

7. The circuit of claim 1,
    wherein each DCC includes multiple sets of capacitors;
    wherein the capacitors of a first capacitance set within each DCC each has a first capacitance value;
    wherein capacitors of a second capacitor set within each DCC each have a second capacitance value that is larger than the first capacitance value; and
    wherein capacitors of a third capacitor set within each DCC each have a third capacitance value that is larger than the second capacitance value; and further including:
    control circuitry operable to control a total amount of capacitance applied from each DCC to an output of its inverter by,
    causing each DCC to apply to the output of its inverter one or more capacitors from the second set instead of applying a substantially equivalent amount of capacitance from the first set if the total amount of capacitance exceeds a prescribed multiple of the first capacitance value by a prescribed amount, and
    causing each DCC to apply to the output of its inverter one or more capacitors from the third set instead of applying a substantially equivalent amount of capacitance from the second set if the total amount of capacitance exceeds a prescribed multiple of the second capacitance value by a prescribed amount.

8. The circuit of claim 1,
    wherein each DCC includes multiple sets of capacitors;
    wherein the capacitors of a first capacitance set within each DCC each have a first capacitance value;
    wherein capacitors of a second capacitor set within each DCC each have a second capacitance value that is larger than the first capacitance value;
    wherein capacitors of a third capacitor set within each DCC each have a third capacitance value that is larger than the second capacitance value; and wherein capacitors of a fourth capacitor set within each DCC each have a fourth capacitance value that is larger than the third capacitance value; and further including:

control circuitry operable to control a total amount of capacitance applied from each DCC to an output of its inverter by, causing each DCC to apply to the output of its inverter one or more capacitors from the second set instead of applying a substantially equivalent amount of capacitance from the first set if the total amount of capacitance exceeds a prescribed multiple of the first capacitance value by a prescribed amount, and causing each DCC to apply to the output of its inverter one or more capacitors from the third set instead of applying a substantially equivalent amount of capacitance from the second set if the total amount of capacitance exceeds a prescribed multiple of the second capacitance value by a prescribed amount, and causing each DCC to apply to the output of its inverter one or more capacitors from the fourth set instead of applying a substantially equivalent amount of capacitance from the third set if the total amount of capacitance exceeds a prescribed multiple of the third capacitance value by a prescribed amount.

9. The circuit of claim 1, wherein each DCC includes multiple sets of capacitors;

wherein the capacitors of a first capacitor set within each DCC each have a first capacitance value; and wherein capacitors of a second capacitor set within each DCC each have a second capacitance value that is a larger than the first capacitance value;

wherein capacitors of a third capacitor set within each DCC each have a third capacitance value that is larger than the second capacitance value; and further including:

control circuitry operable to produce control signaling that controls a total amount of capacitance applied from each DCC to an output of its inverter by causing each DCC to apply the fewest number total number of capacitances to each inverter unit.

10. The circuit of claim 1, wherein each DCC includes multiple sets of capacitors;

wherein the capacitors of a first capacitor set within each DCC each have a first capacitance value; and wherein capacitors of a second capacitor set within each DCC each have a second capacitance value that is larger than the first capacitance value; and further including:

control circuitry operable to control a total amount of capacitance applied from each DCC to the output of its inverter by, causing near half of the first capacitors and near half of the second capacitors of each DCC to be applied to the output of its inverter upon reset;

causing each DCC to apply to the output of its inverter one or more capacitors from the second set instead of applying a substantially equivalent amount of capacitance from the first set if the total amount of capacitance exceeds a prescribed multiple of the first capacitance value by a prescribed amount.

11. The circuit of claim 1, wherein each DCC includes a multiplicity of respective capacitors; and further including:

multiple sets of switches;

wherein each switch set includes individual switches that are controllable to individually apply individual capacitors of one of the DCCs to an output of a corresponding one of the inverters; and control circuitry operable to cause the switch sets apply substantially the same amounts of capacitance to their corresponding inverters.

12. The circuit of claim 1, wherein the multiple inverters include multiple single ended inverters.

13. The circuit of claim 1, wherein the multiple inverters include multiple differential inverters.

14. A digitally controlled oscillator circuit comprising:

a ring oscillator including multiple inverters;

multiple digitally controlled capacitances (DCCs), each applying a digitally controllable amount of capacitance to an output of a different one of the inverters;

a plurality of switch transistors, each operable to control application of an associated individual capacitance of an individual DCC to one of the inverters;

control circuitry operable to produce individual switch control signals for the plurality of individual switch transistors to cause the switch transistors to change an amount of capacitance applied to each inverter during operation of the ring oscillator and to cause the switch transistors to apply substantially equal amounts of capacitance to each of the inverters; and a plurality of voltage level shifting circuits, each associated with a different one of the switch transistors and each operable to level shift a control signal produced by the control circuitry for its associated switch transistor and to provide a level shifted version of the control signal to its associated switch transistor.

15. A digitally controlled oscillator circuit comprising:

a ring oscillator including multiple inverters;

multiple digitally controlled capacitances (DCCs), each applying a digitally controllable amount of capacitance to an output of a different one of the inverters;

wherein each DCC includes multiple sets of capacitors;

wherein the capacitors of a first capacitor set within each DCC each have a first capacitance value; and wherein capacitors of a second capacitor set within each DCC each have a second capacitance value that is larger than the first capacitance value; and further including:

control circuitry operable to control a total amount of capacitance applied from each DCC to the output of its inverter by causing each DCC to apply to the output of its inverter one or more capacitors from the second set instead of applying a substantially equivalent amount of capacitance from the first set if the total amount of capacitance exceeds a prescribed multiple of the first capacitance value by a prescribed amount.

16. A digitally controlled oscillator circuit comprising:

a ring oscillator including multiple inverters, each biased between a power supply voltage and an effective ground level voltage;

multiple digitally controlled capacitances (DCCs), each coupled to apply a digitally controllable amount of capacitance to an output of a different one of the inverters;

control circuitry operable to change an amount of capacitance applied to each inverter during operation of the ring oscillator and to cause the multiple DCCs to apply substantially the same amounts of capacitance to each of the inverters;
each coupled between a power supply voltage and an effective ground level voltage;
voltage stabilizing circuitry operable to maintain a substantially fixed voltage difference between the power supply voltage and an effective ground voltage despite variations the power supply voltage; and
multiple guard transistors biased based upon the substantially fixed difference between the power supply voltage and the effective ground voltage and coupled to cause the inverters in the ring oscillator to oscillate at a substantially constant amplitude even in the presence of voltage noise.

17. A digitally controlled oscillator circuit comprising:
multiple means for inverting a signal coupled in a ring oscillator configuration;
means for applying a digitally controllable amount of capacitance to each means for inverting; and
means for guarding said means for inverting from voltage noise.

18. The circuit of claim 17 further including:
means for causing the means for applying capacitance to apply substantially the same amount of capacitance to each of the means for inverting.

19. The circuit of claim 17 further including:
means for causing the means for applying capacitance to change an amount of capacitance applied to each means for inverting while applying substantially the same amount of capacitance to each of the means for inverting.

20. The circuit of claim 17,
wherein the means for applying includes multiple individual means for applying, each individual means for applying a digitally controllable amount of capacitance to a different one of the means for inverting; and
means for controlling the multiple individual means for applying so as to change the amount of capacitance applied to each means for inverting and so as to cause each of the multiple individual means for applying to apply substantially the same amount of capacitance to a different one of the means for inverting.

21. The circuit of claim 17,
wherein each means for inverting is biased between a power supply voltage and an effective ground level voltage, and
wherein said guarding means causes the means for inverting to oscillate at a substantially constant amplitude even in the presence of voltage noise.

22. The circuit of claim 17 wherein said guarding means guards against variations in amplitude of oscillation of the inverters in the presence of voltage noise.

23. A method of operating a multiple inverter ring oscillator comprising:
changing an amount of capacitance applied to each of a plurality of inverters during operation of the ring oscillator;
applying substantially the same amounts of capacitance to each of said plurality of inverters; and
guarding said plurality of inverters via a plurality of guard transistors from voltage noise.

24. The method of claim 23,
wherein applying substantially the same amounts of capacitance to each of the inverters further includes:
applying a controllable amount of capacitance from each of multiple means for applying a capacitance to a different one of multiple means for inverting; and
causing each of the multiple individual means for applying to apply substantially the same amount of capacitance to a different one of the means for inverting.

25. The method of claim 23, further including:
guarding the inverters from voltage noise.

26. The method of claim 23, further including:
guarding against variations in amplitude of oscillation of the inverters in the presence of voltage noise.

27. The method of claim 23, further including:
controlling a total amount of capacitance applied from each of multiple DCCs to each of the multiple inverters by,
causing each DCC to apply to one of the inverters, one or more capacitors from a second set of capacitors each having a second capacitance value, instead of applying a substantially equivalent amount of capacitance from a first set of capacitors, each having a first capacitance value that is smaller than the second capacitance value, if the total amount of capacitance exceeds a prescribed multiple of the first capacitance value by a prescribed amount; and
causing each DCC to apply to one of the inverters, one or more capacitors from a third set of capacitors each having a third capacitance value, instead of applying a substantially equivalent amount of capacitance from a second set of capacitors, each having the second capacitance value that is smaller than the third capacitance value, if the total amount of capacitance exceeds a prescribed multiple of the second capacitance value by a prescribed amount.

28. The method of claim 23, further including:
controlling a total amount of capacitance applied from each of multiple DCCs to each of the multiple inverters by,
causing each DCC to apply to one of the inverters, one or more capacitors from a second set of capacitors each having a second capacitance value, instead of applying a substantially equivalent amount of capacitance from a first set of capacitors, each having a first capacitance value that is smaller than the second capacitance value, if the total amount of capacitance exceeds a prescribed multiple of the first capacitance value by a prescribed amount;
causing each DCC to apply to one of the inverters, one or more capacitors from a third set of capacitors each having a third capacitance value, instead of applying a substantially equivalent amount of capacitance from a second set of capacitors, each having the second capacitance value that is smaller than the third capacitance value, if the total amount of capacitance exceeds a prescribed multiple of the second capacitance value by a prescribed amount; and
causing each DCC to apply to one of the inverters, one or more capacitors from a fourth set of capacitors each having a fourth capacitance value, instead of applying a substantially equivalent amount of capacitance from a third set of capacitors, each having the third capacitance value that is smaller than the fourth capacitance value, if the total amount of capacitance exceeds a prescribed multiple of the third capacitance value by a prescribed amount.

29. The method of claim 25, further including:
causing each of multiple individual DCCs to apply substantially the same capacitance to a different one of the inverters while causing each individual DCC to apply the fewest number total number of capacitances to each different inverter unit.

30. The method of claim 23 further including:

controlling a total amount of capacitance applied from each of multiple DCCs to each of the multiple inverters by causing each DCC to apply to one of the inverters, one or more capacitors from a second set of capacitors that each having a second capacitance value, instead of applying a substantially equivalent amount of capacitance from a first set of capacitors, each having a first capacitance value that is smaller than the second capacitance value, if the total amount of capacitance exceeds a prescribed multiple of the first capacitance value by a prescribed amount; and causing near half of the first capacitors and near half of the second capacitors of each DCC to be applied to its corresponding inverter upon reset.

31. A method of operating a multiple inverter ring oscillator comprising:

changing an amount of capacitance applied to each of a plurality of inverters during operation of the ring oscillator;

applying substantially the same amounts of capacitance to each of said plurality of inverters;

biasing each inverter between a power supply voltage and an effective ground level voltage; and causing each inverter to oscillate at a substantially constant amplitude even in the presence of voltage noise.

32. A method of operating a multiple inverter ring oscillator comprising:

changing an amount of capacitance applied to each of a plurality of inverters during operation of the ring oscillator;

applying substantially the same amounts of capacitance to each of said plurality of inverters;

controlling a total amount of capacitance applied from each of multiple DCCs to each of the multiple inverters by causing each DCC to apply to one of the inverters, one or more capacitors from a second set of capacitors that each having a second capacitance value, instead of applying a substantially equivalent amount of capacitance from a first set of capacitors, each having a first capacitance value that is smaller than the second capacitance value, if the total amount of capacitance exceeds a prescribed multiple of the first capacitance value by a prescribed amount.

* * * * *

UNITED STATES PATENT AND TRADEMARK OFFICE
CERTIFICATE OF CORRECTION

PATENT NO. : 7,330,081 B1
APPLICATION NO. : 11/178130
DATED : February 12, 2008
INVENTOR(S) : Gil Asa et al.

It is certified that error appears in the above-identified patent and that said Letters Patent is hereby corrected as shown below:

| | |
|---|---|
| Column 1, Line 62-63 | Delete "." after "inverters" and delete "Changing" and insert -- changing -- and insert -- of -- after "capacitance" |
| Column 2, Line 48 | Insert -- in -- after "variations" |
| Column 4, Line 6 | Delete second occurrence of "between a" |
| Column 5, Line 61 | Delete "of the" after "on the" |
| Column 6, Line 6 | Delete "the" after "kept at" |
| Column 6, Line 7 | Delete "the" after "applying" |
| Column 8, Line 1 | Delete "a" after "that" |
| Column 8, Line 5 | Insert -- it -- after "that" and insert -- a -- after "relatively" |
| Column 10, Line 26 | Delete "wet" and insert -- set -- |
| Column 10, Line 35 | Delete "turns" and insert -- turn -- |
| Column 10, Line 56 | Delete "," after "encoding" and insert -- . -- |
| Column 13, Line 13-14 | Delete second occurrence of "at each increment" |
| Column 15, Line 4 | Delete "-type" after "n-type" |
| Column 16, Line 4 | Insert -- in -- after "variations" |
| Column 16, Line 18 | Insert -- in -- after "variations" |
| Column 17, Line 34 | Delete "a" after "is" |
| Column 17, Line 44 | Delete "number" after "fewest" |
| Column 18, Line 9 | Insert -- to -- after "sets" |
| Column 19, Line 11 | Insert -- in -- after "variations" |
| Column 21, Line 2 | Delete "number" after "fewest" |

Signed and Sealed this

Fifth Day of August, 2008

JON W. DUDAS
*Director of the United States Patent and Trademark Office*